(12) United States Patent
Takenouchi (10) Patent No.: US 10,354,893 B2
(45) Date of Patent: *Jul. 16, 2019

(54) CUTTING APPARATUS AND WAFER CUTTING METHOD

(71) Applicant: DISCO CORPORATION, Tokyo (JP)

(72) Inventor: Kenji Takenouchi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 148 days.

This patent is subject to a terminal disclaimer.

(21) Appl. No.: 15/051,241

(22) Filed: Feb. 23, 2016

(65) Prior Publication Data

US 2016/0260626 A1    Sep. 8, 2016

(30) Foreign Application Priority Data

Mar. 3, 2015 (JP) ................................ 2015-041177

(51) Int. Cl.
  *H01L 21/67*   (2006.01)
  *B28D 5/02*   (2006.01)
  *H01L 21/78*   (2006.01)

(52) U.S. Cl.
  CPC ........ *H01L 21/67092* (2013.01); *B28D 5/022* (2013.01); *H01L 21/78* (2013.01)

(58) Field of Classification Search
  CPC ... H01L 21/67092; H01L 21/78; B28D 5/022; B28D 1/121; B24D 3/28; B24D 3/06; B24D 18/00; B24D 5/12
  See application file for complete search history.

(56) References Cited

U.S. PATENT DOCUMENTS

| | | | |
|---|---|---|---|
| 3,916,584 A | | 11/1975 | Howard et al. |
| 4,016,855 A | * | 4/1977 | Mimata ................. B23D 59/02 125/13.01 |
| 4,787,362 A | | 11/1988 | Boucher et al. |
| 5,718,615 A | | 2/1998 | Boucher et al. |
| 6,010,396 A | * | 1/2000 | Ohmiya ............... B23D 59/001 451/446 |

(Continued)

FOREIGN PATENT DOCUMENTS

| | | |
|---|---|---|
| JP | 2001-144034 | 5/2001 |
| JP | 2008-004822 | 1/2008 |

OTHER PUBLICATIONS

Takenouchi, Kenji, U.S. Appl. No. 15/004,492, filed Jan. 22, 2016.

(Continued)

*Primary Examiner* — Jonathan G Riley (74) *Attorney, Agent, or Firm* — Greer Burns & Crain, Ltd.

(57) ABSTRACT

Cutting apparatus includes a chuck table for holding a workpiece, a cutting unit for cutting the workpiece held on the chuck table, and a feeding mechanism for relatively moving the chuck table and the cutting unit. The cutting unit includes a spindle adapted to be rotationally driven, a rotatable cutting blade mounted on the spindle and having a peripheral cutting edge, a cutting water nozzle for supplying a cutting water to the cutting blade, a photocatalyst member provided so as to come into contact with the cutting water supplied from the cutting water nozzle, and a light applying unit for exciting the photocatalyst member to thereby give an oxidizing power due to hydroxy radicals to the cutting water.

8 Claims, 6 Drawing Sheets

(56) References Cited

U.S. PATENT DOCUMENTS

| | | | |
|---|---|---|---|
| 6,105,567 A * | 8/2000 | Sun | H01L 21/78 |
| | | | 125/13.01 |
| 6,357,330 B1 | 3/2002 | Dass et al. | |
| 7,029,374 B2 | 4/2006 | Chen | |
| 2002/0019199 A1 | 2/2002 | Goers et al. | |
| 2005/0106782 A1 | 5/2005 | Genda et al. | |
| 2005/0277270 A1 | 12/2005 | Yoshikawa et al. | |
| 2006/0062675 A1 | 3/2006 | Chiu et al. | |
| 2008/0210066 A1 * | 9/2008 | Arterburn | D01G 1/04 |
| | | | 83/22 |
| 2011/0124181 A1 * | 5/2011 | Suzuki | B28D 5/0011 |
| | | | 438/464 |
| 2014/0208659 A1 | 7/2014 | Sottke et al. | |
| 2014/0359965 A1 * | 12/2014 | Hansen | B08B 1/00 |
| | | | 15/320 |
| 2015/0105006 A1 | 4/2015 | Beaucage et al. | |
| 2015/0367529 A1 * | 12/2015 | Wang | B28D 7/02 |
| | | | 134/6 |
| 2016/0035653 A1 * | 2/2016 | Niu | H01L 23/49562 |
| | | | 257/368 |

OTHER PUBLICATIONS

Takenouchi, Kenji, Non-final Office Action dated Jun. 27, 2017 for U.S. Appl. No. 15/004,492.

Takenouchi, Kenji, Final Office Action dated Dec. 14, 2017 for U.S. Appl. No. 15/004,492.

Takenouchi, Kenji, Final Office Action dated May 22, 2016 for U.S. Appl. No. 15/004,492.

Takenouchi, Kenji, Final Office Action dated Jun. 21, 2018 for U.S. Appl. No. 15/004,492.

Takenouchi, Kenji, Final Office Action dated Oct. 1, 2018 for U.S. Appl. No. 15/004,492.

* cited by examiner

CUTTING APPARATUS AND WAFER CUTTING METHOD

BACKGROUND OF THE INVENTION

Field of the Invention

The present invention relates to a cutting apparatus including a cutting blade and also to a wafer cutting method.

Description of the Related Art

A plurality of devices such as ICs and LSIs are formed on the front side of a wafer so as to be separated by a plurality of division lines (streets). The wafer thus having the devices is divided along the division lines into individual device chips by using a cutting apparatus including a rotatable cutting blade (see Japanese Patent Laid-open No. 2001-144034, for example). The device chips are used in various electronic equipment. To increase the speed of processing by the ICs and LSIs, the resistance or capacitance of wiring in each device must be reduced. This is due to the fact that a signal delay having a large effect on a processing speed is determined by the product of resistance and capacitance. In a wafer put in a practical use, low-permittivity insulator films and metal foils are alternately stacked to form a multilayer structure on the upper surface of a semiconductor substrate such as a silicon substrate. Each low-permittivity insulator film is formed from an inorganic film such as SiOF film (fluorine-doped silicon oxide film) and BSG film or an organic film such as a polymer film of polyimide or parylene. Each metal foil is formed of copper, aluminum, etc. The multilayer structure formed on the upper surface of the semiconductor substrate forming this wafer is also partitioned by a plurality of crossing division lines to form a plurality of devices.

Each low-permittivity insulator film is called a low-k film because it has a low relative permittivity k. The stacked low-k films are formed not only on the surface of each device, but also on the surface of each street. Since the number of interlayer spacings in the stacked low-k films is large, the stacked low-k films are very brittle and they are prone to separate from the surface of each device like mica. Accordingly, when each street is cut by using a cutting blade, there is a possibility of delamination of the low-k films in the range from each street to the adjacent devices due to the ductility of the metal forming the metal foils, causing a remarkable reduction in quality of each device. As a method for preventing such delamination reaching the adjacent devices, there has been proposed a method including the steps of applying a laser beam along each street to thereby remove the low-k films present on each street and next cutting a semiconductor substrate exposed along each street by using a cutting blade (see Japanese Patent Laid-open No. 2008-4822, for example).

SUMMARY OF THE INVENTION

However, in the above method described in Japanese Patent Laid-open No. 2008-4822, there is a problem that thermal strain is left in the semiconductor substrate by the application of the laser beam, causing a reduction in die strength of each device. Further, also in the case of cutting a wafer having a metal film called TEG (Test Element Group) on each street, there is a problem that when each street is cut by a cutting blade, burrs may be generated due to the ductility of the metal or the TEG may be separated, causing a reduction in quality of each device.

In addition, in the case of cutting a hard-to-cut material such as a gallium nitride (GaN) substrate and a silicon carbide (SiC) substrate by using a cutting blade, there is a problem that cracks may be generated so as to extend from each street to the adjacent devices or the surface of each device may be separated. Accordingly, it is difficult to cut such a hard-to-cut material by using a cutting blade.

It is therefore an object of the present invention to provide a cutting apparatus which can be used in cutting a wafer having low-k films or TEG formed on each street or in cutting a hard-to-cut material such as a GaN substrate and an SiC substrate by a cutting blade without any preliminary processing by a laser beam or the like along each street, thereby preventing a reduction in quality of each device.

It is another object of the present invention to provide a wafer cutting method using the cutting apparatus.

In accordance with an aspect of the present invention, there is provided a cutting apparatus including a chuck table for holding a workpiece; a cutting unit for cutting the workpiece held on the chuck table; and a feeding mechanism for relatively moving the chuck table and the cutting unit; the cutting unit including a spindle adapted to be rotationally driven, a rotatable cutting blade mounted on the spindle and having a peripheral cutting edge, a cutting water nozzle for supplying a cutting water to the cutting blade, a photocatalyst member provided so as to come into contact with the cutting water supplied from the cutting water nozzle, and a light applying unit for exciting the photocatalyst member to thereby give an oxidizing power due to hydroxy radicals to the cutting water.

Preferably, the photocatalyst member includes a titanium oxide ($TiO_2$) plate.

In accordance with another aspect of the present invention, there is provided a wafer cutting method including wafer holding step of holding a wafer on a chuck table; a cutting step of positioning a cutting blade rotating at a high speed to a predetermined cutting area, the cutting blade having a peripheral cutting edge, and relatively moving the cutting blade and the chuck table as supplying a cutting water to the cutting blade to cut the wafer; and a light applying step of bringing a photocatalyst member into contact with the cutting water and applying light for exciting the photocatalyst member in cutting the wafer, thereby giving an oxidizing power due to hydroxy radicals to the cutting water.

In the cutting apparatus according to the present invention, the cutting unit includes the spindle adapted to be rotationally driven, the rotatable cutting blade mounted on the spindle and having the peripheral cutting edge, the cutting water nozzle for supplying a cutting water to the cutting blade, the photocatalyst member provided so as to come into contact with the cutting water, and the light applying unit for exciting the photocatalyst member to thereby give an oxidizing power due to hydroxy radicals to the cutting water. Accordingly, in the case of cutting a wafer having stacked low-k films (inclusive of stacked metal foils) or TEG on each street by using the cutting apparatus according to the present invention, the following effect can be attained. When light (preferably, ultraviolet light) is applied to the photocatalyst member adapted to come into contact with the cutting water, the photocatalyst member is excited by the light applied. Accordingly, when the cutting water to be supplied to the cutting blade is brought into contact with the photocatalyst member excited, an oxidizing power due to hydroxy radicals is given to the cutting water to be supplied to the cutting blade, thereby oxidizing the stacked metal foils or the TEG present on each street. Accordingly, the wafer can be cut along each street by using the cutting blade as blocking the ductility of the metal present in the range from each street to the adjacent devices, so that the delamination of the stacked low-k films or the TEG from the surface of the wafer can be suppressed. Further, the generation of burrs can also be prevented. Further, also in the case that the wafer to be cut is a GaN substrate or an SiC substrate, each street can be weakened by the strong oxidizing power in cutting the wafer by using the cutting blade, so that the wafer can be cut by the cutting blade.

In the case that the photocatalyst member is a titanium oxide ($TiO_2$) plate, the titanium oxide plate can be excited by applying ultraviolet light thereto. When the cutting water to be supplied to the cutting blade comes into contact with the titanium oxide plate excited, the strong oxidizing power due to the hydroxy radicals can be given to the cutting water to be supplied to the cutting blade.

The wafer cutting method according to the present invention includes the cutting step of cutting the wafer by using the cutting blade, wherein the cutting water is supplied to the cutting blade and the light for exciting the photocatalyst member is applied to the photocatalyst member, so that the photocatalyst member excited comes into contact with the cutting water to be supplied to the cutting blade. As a result, hydroxy radicals are produced in the cutting water. The hydroxy radicals produced function to oxidize the stacked metal foils or the TEG formed on each street. Accordingly, the wafer can be cut along each street by using the cutting blade as blocking the ductility of the metal present in the range from each street to the adjacent devices, so that the delamination of the stacked low-k films or the TEG from the surface of the wafer can be suppressed. Further, the generation of burrs can also be prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
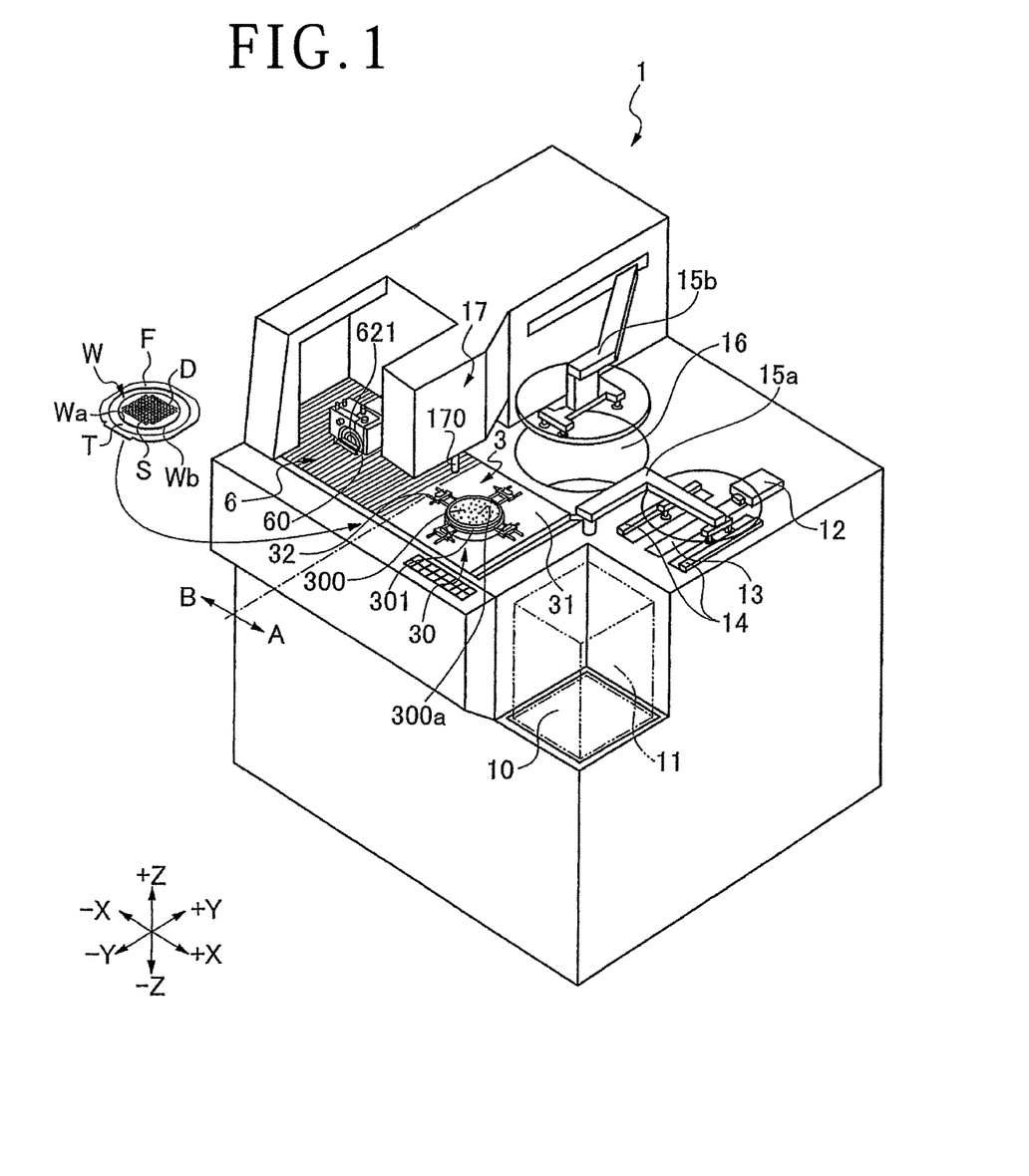
FIG. 1 is a perspective view of a cutting apparatus according to a preferred embodiment of the present invention.

Referring to FIG. 1, there is shown a cutting apparatus 1 for cutting a wafer W according to a preferred embodiment of the present invention. The wafer W is a semiconductor wafer, for example. The wafer W has an upper surface (front side) Wa and a lower surface (back side) Wb. The wafer W is composed of a silicon substrate and a plurality of stacked low-k films and metal foils formed on the upper surface of the silicon substrate. Accordingly, the upper surface of the stacked low-k films and metal foils forms the upper surface Wa of the wafer W. The upper surface Wa of the wafer W is partitioned by a plurality of crossing streets S to define a plurality of separate regions where a plurality of devices D are each formed. The lower surface Wb of the wafer W is attached to the upper surface (adhesive surface) of a dicing tape T at its central portion. The peripheral portion of the dicing tape T is attached to an annular frame F. Accordingly, the wafer W is supported through the dicing tape T to the annular frame F. The shape and kind of the wafer W are not especially limited. Examples of the wafer W also include a wafer having a TEG on each street, a GaN substrate, and an SiC substrate.

The cutting apparatus 1 shown in FIG. 1 includes holding means 3 for holding the wafer W and cutting means (cutting unit) 6 for cutting the wafer W held by the holding means 3. The holding means 3 is movable in the X direction by X moving means or work feeding means (feeding mechanism) (not shown). The cutting means 6 is movable in the Y direction by Y moving means or indexing means (indexing mechanism) (not shown) and also movable in the Z direction by Z moving means or cutter feeding means (not shown).

An elevating mechanism 10 for moving a wafer cassette 11 in the Z direction is provided at a front end portion of the cutting apparatus 1, wherein the wafer cassette 11 is placed on the upper surface of the elevating mechanism 10. A plurality of wafers W each supported through the dicing tape T to the annular frame F are stored in the wafer cassette 11. Wafer handling means 12 is provided on the rear side (+Y side) of the wafer cassette 11 to take one of the wafers W out of the wafer cassette 11 before cutting or to return the wafer W into the wafer cassette 11 after cutting. A temporary placement area 13 for temporarily placing the wafer W before cutting or after cutting is provided between the wafer cassette 11 and the wafer handling means 12. In the temporary placement area 13, there is provided positioning means 14 for positioning the wafer W temporarily placed.

First transfer means 15a is provided in the vicinity of the temporary placement area 13 to transfer the wafer W between the holding means 3 and the temporary placement area 13. The first transfer means 15a is so configured as to hold the wafer W under suction, whereby the wafer W to be cut is held under suction and then transferred from the temporary placement area 13 to the holding means 3 by the first transfer means 15a.

Cleaning means 16 for cleaning the wafer W after cutting is provided in the vicinity of the first transfer means 15a. Further, there is provided above the cleaning means 16 second transfer means 15b for transferring the wafer W from the holding means 3 to the cleaning means 16 after cutting. The second transfer means 15b is also configured so as to hold the wafer W under suction.

The holding means 3 shown in FIG. 1 is specifically configured as a chuck table 30, for example. The chuck table 30 is circular in outside shape, and it includes a suction holding portion 300 for holding the wafer W under suction and a frame member 301 for supporting the suction holding portion 300. The suction holding portion 300 has a suction holding surface 300a as an exposed surface communicating with a vacuum source (not shown), wherein the wafer W is held on the suction holding surface 300a under suction. The chuck table 30 is surrounded by a cover 31. The chuck table 30 is rotatable about its axis extending in the Z direction by any rotating means (not shown). Further, clamping means 32 for clamping the annular frame F is provided around the chuck table 30.

The chuck table 30 is reciprocatively movable in the X direction by the X moving means (not shown) provided under the cover 31, between a standby area A where the wafer W is held or upheld on the chuck table 30 before cutting or after cutting and a cutting area B where the wafer W is cut by the cutting means 6. There is provided above a moving path of the chuck table 30 alignment means 17 for detecting the streets S to be cut. The alignment means 17 includes imaging means 170 for imaging the upper surface Wa of the wafer W and can detect the streets S to be cut according to an image obtained by the imaging means 170. The cutting means 6 for cutting the wafer W held on the chuck table 30 is provided in the cutting area B in the vicinity of the alignment means 17. The cutting means 6 and the alignment means 17 are integrated and they are movable together in the Y direction and the Z direction.

Figure 2:
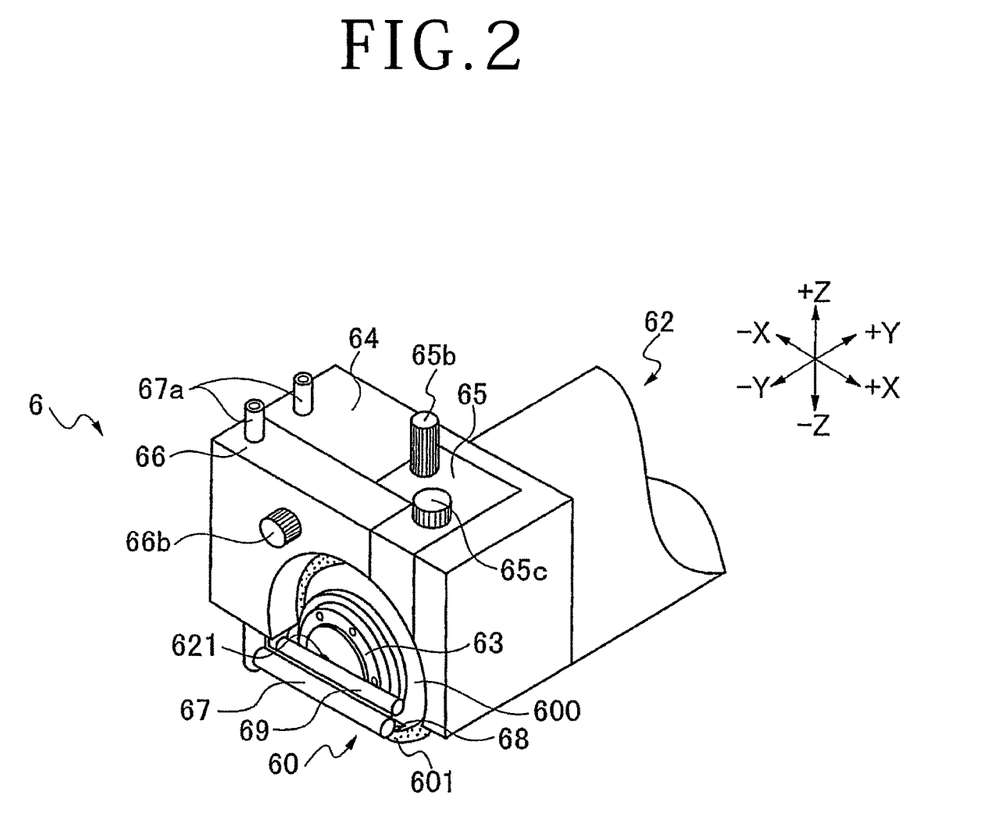
FIG. 2 is a perspective view of cutting means included in the cutting apparatus shown in FIG. 1.

As shown in FIG. 2, the cutting means 6 includes a spindle unit 62 having a spindle 621, a rotatable cutting blade 60 mounted on the spindle 621 of the spindle unit 62 and having a peripheral cutting edge 601, a blade cover 64 for covering the cutting blade 60, a blade detecting block 65 mounted on the blade cover 64, a detachable cover 66 mounted on the blade cover 64, a pair of cutting water nozzles 67 (see FIG. 5) for supplying a cutting water to the cutting blade 60, a pair of photocatalyst members 68 (see FIG. 5) adapted to come into contact with the cutting water supplied from the cutting water nozzles 67, and a pair of light applying units 69 (see FIG. 5) for exciting the photocatalyst members 68 to give an oxidizing power due to hydroxy radicals to the cutting water to be supplied to the cutting blade 60.

Figure 3:
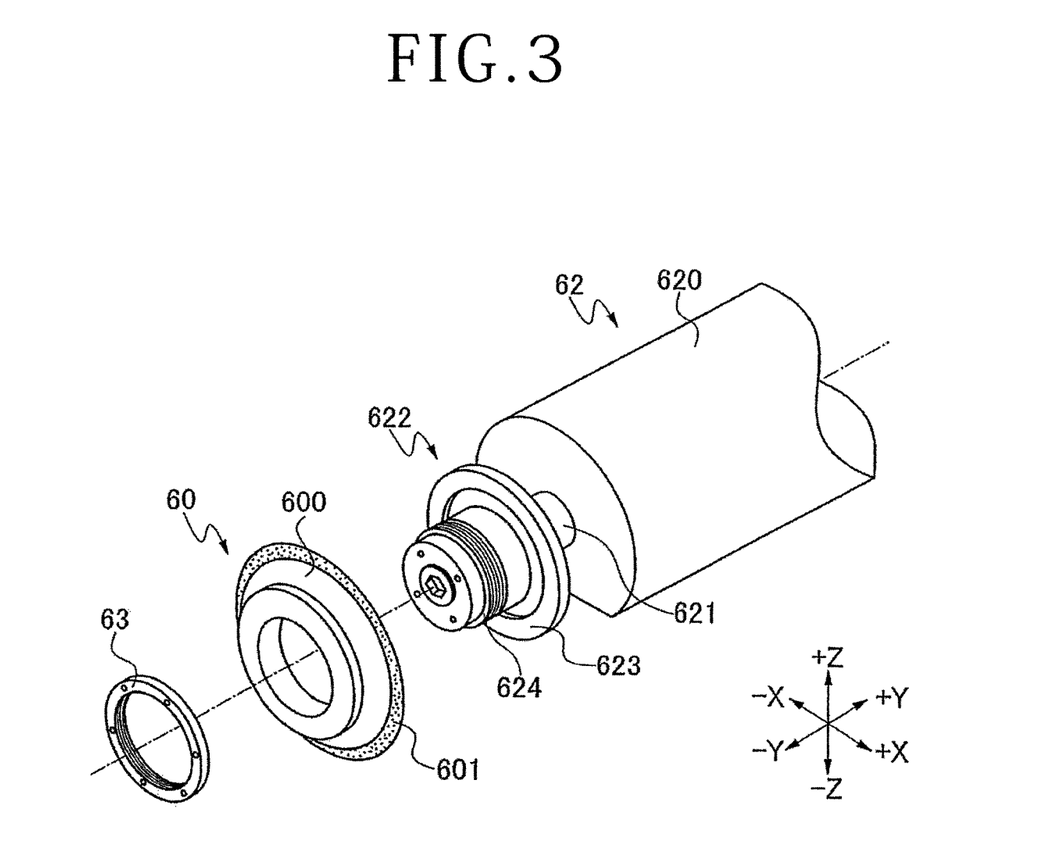
FIG. 3 is an exploded perspective view showing a manner of mounting a cutting blade to a spindle included in the cutting means shown in FIG. 2.

As shown in FIG. 3, the spindle unit 62 includes a spindle housing 620, the spindle 621 rotatably supported in the spindle housing 620 and having an axis extending in the direction (Y direction) perpendicular to the X direction in an XY plane (horizontal plane), and a mount flange 622 detachably mounted on the front end portion of the spindle 621. The mount flange 622 includes a flange portion 623 and a boss portion 624 projecting from the flange portion 623 in its thickness direction (Y direction), the boss portion 624 having an external thread on the outer circumferential surface. The cutting blade 60 has a central hole, through which the boss portion 624 of the mount flange 622 is inserted. After the boss portion 624 of the mount flange 622 is inserted through the central hole of the cutting blade 60, a nut 63 is threadedly engaged with the external thread of the boss portion 624, thereby tightly holding the cutting blade 60 between the nut 63 and the flange portion 623 of the mount flange 622 from the opposite sides in the Y direction. Thusly, the cutting blade 60 is firmly mounted through the mount flange 622 to the spindle 621. The spindle 621 is rotationally driven by a motor (not shown) to thereby rotate the cutting blade 60 at a high speed.

The cutting blade 60 shown in FIG. 3 is an electroformed hub blade, which is composed of a disk-shaped aluminum base (hub) 600 and an annular cutting edge 601 fixed to the peripheral portion of the base 600. The base 600 has a diameter of about 50 mm, for example. The cutting edge 601 is formed by bonding diamond abrasive grains with a nickel plating electroformed binder, for example. The cutting edge 601 has a thickness of about 50 µm and a width of about 0.5 to 2 mm, for example. The cutting blade 60 is not limited to such an electroformed hub blade. For example, the cutting blade 60 may be replaced by a washer type resin bond blade or metal bond blade having an annular shape.

Figure 4:
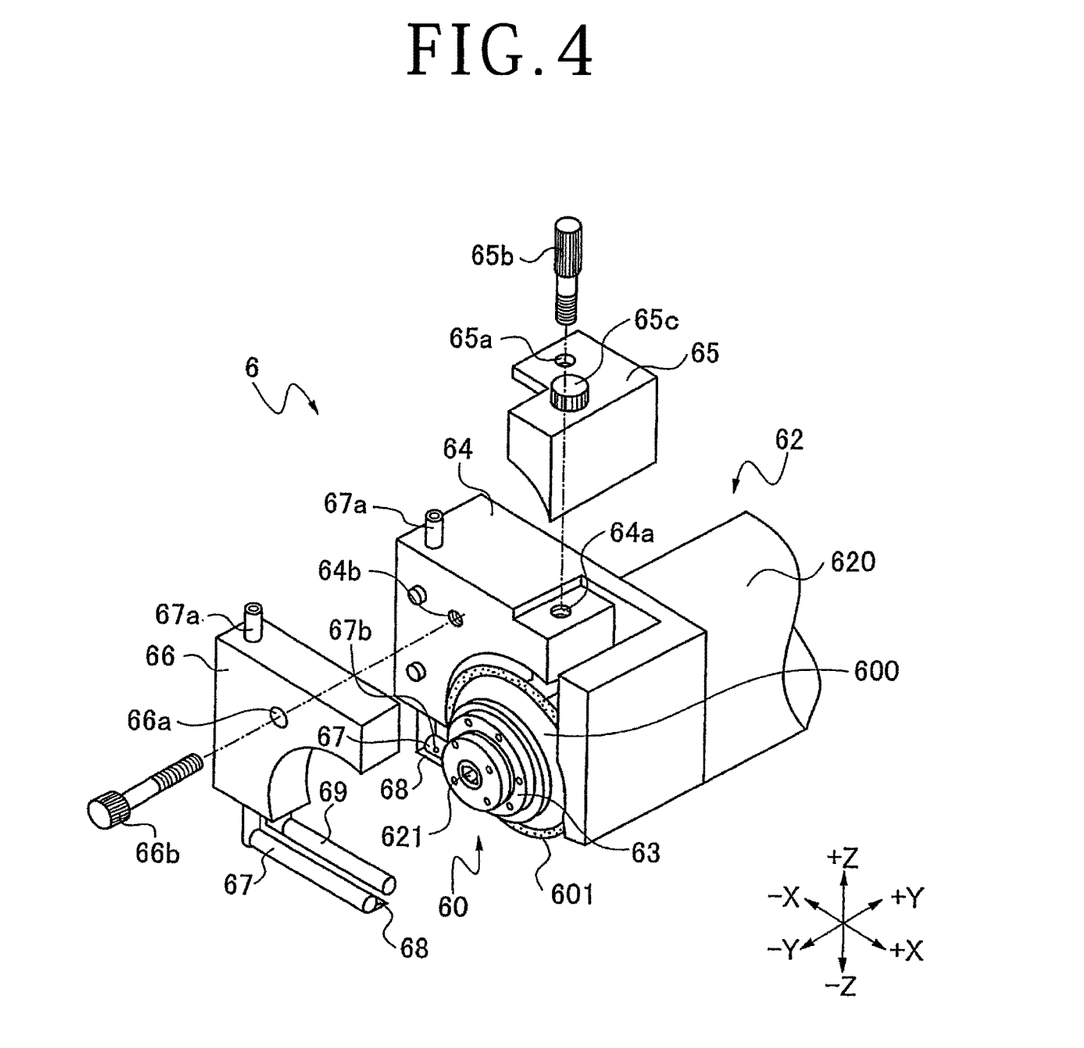
FIG. 4 is an exploded perspective view of the cutting means shown in FIG. 2.

As shown in FIG. 4, the blade cover 64 covers the cutting blade 60 so as to straddle it from the +Z side (the side shown by an arrow +Z) as viewed in the Y direction. The blade detecting block 65 is mounted to the blade cover 64 from the +Z side in such a manner that a screw 65b is inserted through a hole 65a formed in the blade detecting block 65 and threadedly engaged with a tapped hole 64a formed in the blade cover 64. The blade detecting block 65 is provided with a blade sensor (not shown) composed of a light emitting device and a photodetector. The position of the blade sensor in the Z direction is adjustable by an adjusting screw 65c. The condition of the cutting edge 601 of the cutting blade 60 is detected by this blade sensor.

Figure 5:
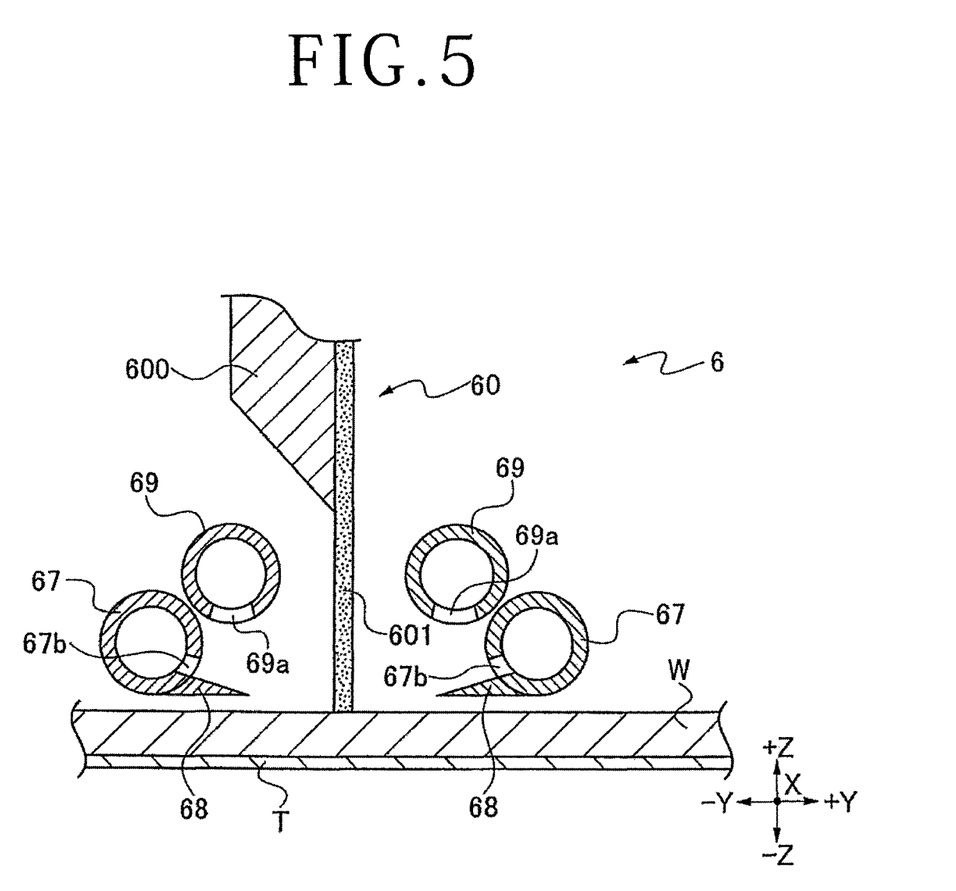
FIG. 5 is a sectional view showing the arrangement of light applying units, cutting water nozzles, and photocatalyst members with respect to the cutting blade.

The detachable cover 66 is mounted to the blade cover 64 from the −Y side (the side shown by an arrow −Y) in such a manner that a screw 66b is inserted through a hole 66a formed in the detachable cover 66 and threadedly engaged with a tapped hole 64b formed in the blade cover 64. As shown in FIGS. 4 and 5, the pair of cutting water nozzles 67 for supplying a cutting water to the cutting blade 60 are provided on the opposite sides of the cutting blade 60 in the Y direction.

The pair of cutting water nozzles 67 are connected to a pair of cutting water inlet pipes 67a for introducing a cutting water, respectively. The cutting water inlet pipe 67a on the +Y side (the side shown by an arrow +Y) is supported to the blade cover 64, whereas the cutting water inlet pipe 67a on the −Y side (the side shown by an arrow −Y) is supported to the detachable cover 66. These cutting water nozzles 67 extend in the X direction along the opposite side surfaces of the cutting blade 60. Each cutting water nozzle 67 has a plurality of nozzle holes 67b for directing a cutting water to a cutting point where the wafer W is cut by the cutting edge 601 of the cutting blade 60. The plural nozzle holes 67b of each cutting water nozzle 67 are arranged in line in the X direction so as to face each side surface of the cutting blade 60.

As shown in FIGS. 4 and 5, each photocatalyst member 68 is specifically configured as a titanium oxide plate, for example. Each titanium oxide plate 68 extends in the X direction along either side surface of the cutting blade 60 and is fixed to the cutting water nozzle 67 on the same side with respect to the cutting blade 60 so as to extend in the longitudinal direction of this corresponding cutting water nozzle 67. That is, the pair of titanium oxide plates 68 as the photocatalyst members are fixed to the pair of cutting water nozzles 67 so as to extend therealong in the X direction, respectively. More specifically, as shown in FIG. 5, each titanium oxide plate 68 is fixed to the corresponding cutting water nozzle 67 at such a position (angle) that the cutting water supplied from the nozzle holes 67b of the cutting water nozzle 67 is received by the titanium oxide plate 68 and then guided toward the cutting edge 601 of the cutting blade 60. However, the position of each titanium oxide plate 68 is not limited to that shown in FIG. 5, provided that this position is defined as a position where the titanium oxide plate 68 comes into contact with the cutting water to be supplied to the cutting edge 601 and does not interfere with the flow of the cutting water directed toward the cutting edge 601. Accordingly, the titanium oxide plates 68 may not be fixed to the cutting water nozzles 67, respectively.

As shown in FIGS. 4 and 5, each light applying unit 69 is specifically configured as an ultraviolet lamp capable of applying ultraviolet light having a wavelength of about 280 to 380 nm, for example. The pair of light applying units 69 are provided on the opposite sides of the cutting blade 60 in the Y direction above the pair of titanium oxide plates 68, respectively. The light applying unit 69 on the +Y side is detachably connected to the blade cover 64 at its lower portion, and the light applying unit 69 on the −Y side is detachably connected to the detachable cover 66 at its lower portion. Each light applying unit 69 has a plurality of light applying holes 69a facing the corresponding titanium oxide plate 68. In a cutting step of cutting the wafer W by using the cutting blade 60, each light applying unit 69 applies ultraviolet light from its light applying holes 69a to the corresponding titanium oxide plate 68 to thereby excite this titanium oxide plate 68. Each light applying unit 69 is not limited to such an ultraviolet lamp for applying ultraviolet light, depending on the kind of each titanium oxide plate 68. For example, in the case that each titanium oxide plate 68 is a nitrogen-doped titanium oxide plate which can develop photocatalytic activity by the irradiation of visible light, each light applying unit 69 may be provided by a xenon lamp or fluorescent lamp capable of applying visible light having a wavelength of about 400 to 740 nm, for example. Further, the connecting position of each light applying unit 69 is not limited to the lower portion of the blade cover 64 or the detachable cover 66, but it is preferably set to a position where ultraviolet light from each light applying hole 69a is directly applied to the corresponding titanium oxide plate 68 without dispersion. Further, the shape and location of each light applying unit 69 are not especially limited, provided that each light applying unit 69 can apply light to the corresponding photocatalyst member 68.

There will now be described with reference to FIGS. 1, 2, and 6 the operation of the cutting apparatus 1 and the cutting method for cutting the wafer W by using the cutting apparatus 1.

(1) Wafer Holding Step

Referring to FIG. 1, the wafer handling means 12 is operated to take one of the plural wafers W out of the wafer cassette 11 to the temporary placement area 13, wherein each wafer W is supported through the dicing tape T to the annular frame F. In the temporary placement area 13, the wafer W is positioned by the positioning means 14. Thereafter, the wafer W is held under suction by the first transfer means 15a and then transferred from the temporary placement area 13 to the holding surface 300a of the chuck table 30 as the holding means 3. Thereafter, the annular frame F is clamped by the clamping means 32, and the wafer W is held under suction on the holding surface 300a. Thus, the wafer W is held by the chuck table 30.

(2) Cutting Step

After performing the wafer holding step, a cutting step is performed to cut the wafer W held on the chuck table 30 by using the cutting means 6. In the cutting step, the X moving means (not shown) is operated to move the chuck table 30 holding the wafer W in the direction of the arrow −X from the standby area A to the cutting area B. During the movement of the chuck table 30, the imaging means 170 is operated to image the upper surface Wa of the wafer W, thereby detecting the streets S to be cut. At the same time, the Y moving means (not shown) is operated to move the cutting means 6 in the Y direction, thereby aligning the cutting blade 60 with a target one of the streets S extending in a first direction.

After performing such alignment between the cutting blade 60 and the target street S to be cut, the X moving means (not shown) is operated again to further move the chuck table 30 holding the wafer W in the direction of the arrow −X at a feed speed of about 50 mm/second, for example. At the same time, the Z moving means (not shown) is operated to lower the cutting means 6 in the direction of the arrow −Z. Further, the spindle 621 is rotated at a high speed of about 20000 rpm by the motor (not shown) to thereby rotate the cutting blade 60 fixed to the spindle 621 at the high speed. During this rotation, the cutting blade 60 is lowered to cut in the wafer W and is relatively fed along the target street S, thereby cutting the wafer W along the target street S. At the time the cutting blade 60 cuts in the wafer W in this cutting step, a cutting water L is introduced from the cutting water inlet pipes 67a shown in FIG. 2 and directed from the nozzle holes 67b of the cutting water nozzles 67 toward the cutting point where the cutting edge 601 of the cutting blade 60 comes into contact with the target street S of the wafer W as shown in FIG. 6. The cutting water L is supplied to the cutting blade 60 at a rate of 2000 cc/minute, for example. The cutting water L directed from the nozzle holes 67b comes into contact with the titanium oxide plates 68 before reaching the cutting point where the cutting edge 601 comes into contact with the target street S.

Figure 6:
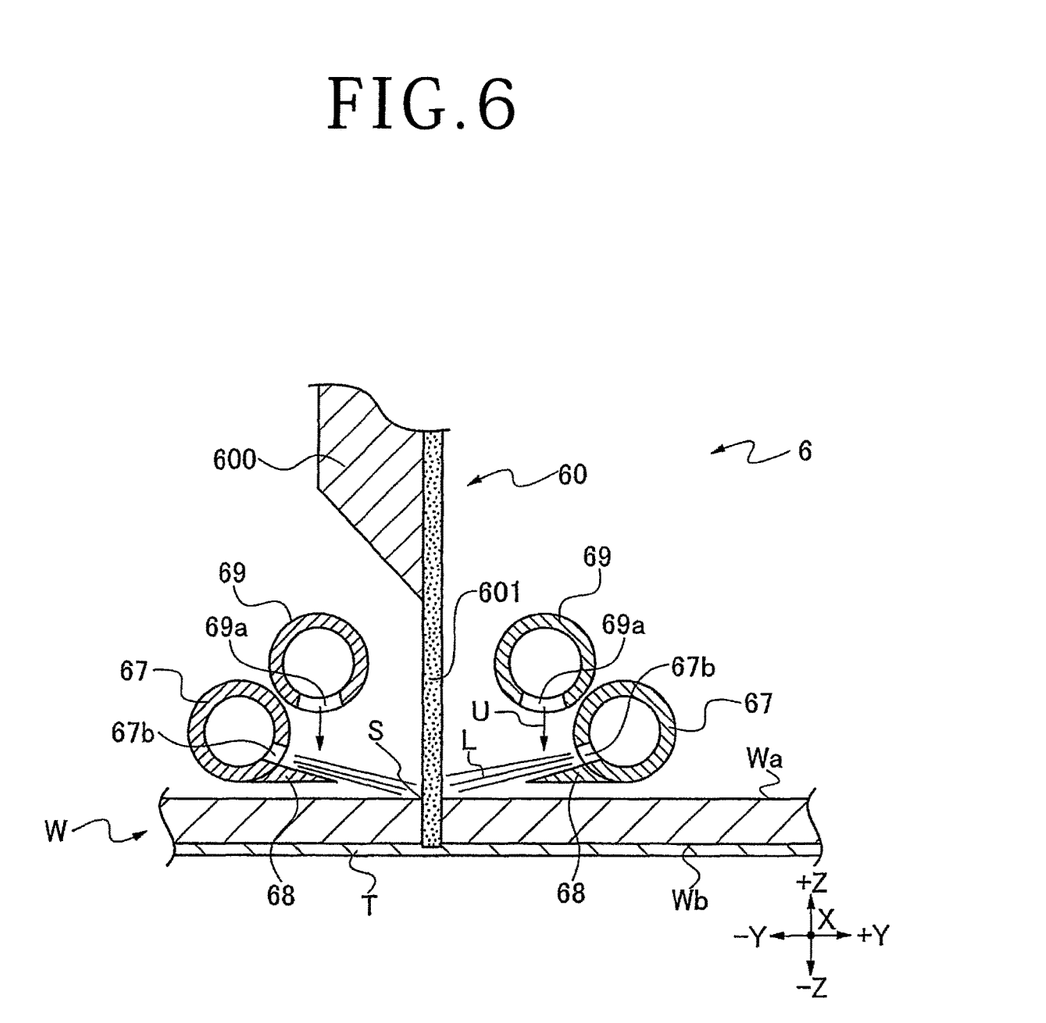
FIG. 6 is a sectional view similar to FIG. 5, showing a cutting step of cutting a wafer according to this preferred embodiment.

Further, as shown in FIG. 6, the light applying units 69 are operated in the cutting step to apply ultraviolet light U having a wavelength of about 365 nm, for example, to the titanium oxide plates 68, thereby exciting the titanium oxide plates 68. The ultraviolet light U is applied during at least a period from the time just before the cutting edge 601 cuts into the target street S of the wafer W to the time when the cutting edge 601 separates from the wafer W. That is, when the ultraviolet light U is applied to the surface of each titanium oxide plate 68, the electron in the valence band of each titanium oxide plate 68 is excited to produce two carriers of electron and hole. The hole produced from each titanium oxide plate 68 operates to produce hydroxy radicals having a high oxidizing power. Accordingly, the oxidizing power of the hydroxy radicals is given to the cutting water L present on the surface of each titanium oxide plate 68.

The cutting water L thus having the oxidizing power due to the hydroxy radicals is directed to reach at least the cutting point where the cutting edge 601 of the cutting blade 60 comes into contact with the target street S of the wafer W. As a result, the metal foils stacked also on each street S of the wafer W are oxidized by the hydroxy radicals produced, thereby blocking the ductility of the metal foils formed on the target street S between the adjacent devices D.

Thus, in this cutting step of cutting the wafer W by using the cutting apparatus 1, the cutting blade 60 can perform cutting of the wafer W in the condition where the ductility of the metal present on the target street S is blocked, so that the delamination of the low-k films occurring in the range from the target street S to the adjacent devices D can be suppressed. Further, chipping and the generation of burrs can also be prevented. Further, since the duration of presence of the hydroxy radicals produced in the cutting water L is very short, there is no possibility that the surface of each device D may be oxidized by the cutting water L. The cutting water L directed to the cutting blade 60 functions to cool the cutting point where the cutting edge 601 comes into contact with the wafer W and also to remove cutting dust generated at the cutting point.

When the chuck table 30 holding the wafer W is moved in the direction of the arrow −X to reach a predetermined position where the cutting of the target street S by the cutting blade 60 is finished, the movement of the chuck table 30 by the X moving means (not shown) is once stopped and the Z moving means (not shown) is next operated to raise the cutting blade 60 away from the wafer W. Thereafter, the X moving means (not shown) is operated to move the chuck table 30 in the direction of the arrow +X to return the chuck table 30 to the original position. Thereafter, the Y moving means (not shown) is operated to move (index) the cutting blade 60 by the pitch of the streets S and the above cutting operation is similarly performed to the next street S extending in the first direction. Such a series of operations is repeated for all the other streets S extending in the first direction. Thereafter, the chuck table 30 is rotated 90 degrees by the rotating means (not shown) to similarly perform the above cutting operation for all the streets S extending in a second direction perpendicular to the first direction. In this manner, all the crossing streets S extending in the first and second directions are cut by the cutting blade 60.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus comprising:
   a chuck table for holding a workpiece;
   a cutting unit for cutting said workpiece held on said chuck table; and
   a feeding mechanism for relatively moving said chuck table and said cutting unit;
   said cutting unit including:
      a spindle adapted to be rotationally driven,
      a rotatable cutting blade mounted on said spindle and having a peripheral cutting edge,
      a cutting water nozzle for supplying a cutting water to said cutting blade,
      a photocatalyst member provided so as to come into contact with said cutting water supplied from said cutting water nozzle, wherein said photocatalyst member is provided at a location such that said cutting water comes into contact with said photocatalyst member after exiting said cutting water nozzle but before contacting said cutting blade, and
      a light applying unit for exciting said photocatalyst member to thereby give an oxidizing power due to hydroxy radicals to said cutting water.

2. The cutting apparatus according to claim 1, wherein said photocatalyst member includes a titanium oxide ($TiO_2$) plate.

3. The cutting apparatus according to claim 1, wherein the light applying unit is configured and arranged for applying ultraviolet light.

4. The cutting apparatus according to claim 1, wherein said photocatalyst member comprises a plate fixed to said cutting water nozzle at a position adjacent to at least one nozzle hole.

5. A cutting apparatus comprising:
   a chuck table for holding a workpiece;
   a cutting unit for cutting said workpiece held on said chuck table; and
   a feeding mechanism for relatively moving said chuck table and said cutting unit;
   said cutting unit including:
      a spindle adapted to be rotationally driven,
      a rotatable cutting blade mounted on said spindle and having a peripheral cutting edge,
      a cutting water nozzle for supplying a cutting water to said cutting blade,
      a photocatalyst member provided so as to come into contact with said cutting water supplied from said cutting water nozzle,
      a light applying unit for exciting said photocatalyst member to thereby give an oxidizing power due to hydroxy radicals to said cutting water, and
   wherein the cutting blade performs cutting of the wafer while ductility of metal foils present on a predetermined target area is reduced due to contact between said cutting water that has been given said oxidizing power and the metal foils, thereby suppressing delamination.

6. A wafer cutting method comprising:
   a wafer holding step of holding a wafer on a chuck table;
   a cutting step of positioning a rotating cutting blade at a predetermined cutting area, said cutting blade having a peripheral cutting edge, and relatively moving said cutting blade and said chuck table in a cutting feed direction;
   a cutting water supplying step of supplying cutting water to said rotating cutting blade and bringing a photocatalyst member into contact with the cutting water wherein said photocatalyst member is provided at a location such that said cutting water comes into contact with said photocatalyst member after exiting said cutting water nozzle but before contacting said cutting blade; and
   a light applying step of applying light for exciting said photocatalyst member in cutting said wafer, thereby giving an oxidizing power due to hydroxy radicals to said cutting water, and
   wherein the cutting blade performs cutting of the wafer while ductility of metal foils present on the predetermined cutting area is reduced due to contact between said cutting water that has been given said oxidizing power and the metal foils, thereby suppressing delamination.

7. The wafer cutting method according to claim 6, wherein said light applying step comprises applying ultraviolet light.

8. The wafer cutting method according to claim 6, wherein said cutting water supplying step comprises passing cutting water through at least one nozzle hole of a cutting water nozzle and then passing the cutting water over a plate fixed to said cutting water nozzle at a position adjacent to said at least one nozzle hole.

* * * * *